United States Patent
Zhu et al.

(10) Patent No.: US 11,239,320 B2
(45) Date of Patent: Feb. 1, 2022

(54) CLASSIFIER CIRCUITS WITH GRAPHENE TRANSISTORS

(71) Applicant: The Board of Trustees of the University of Illinois, Urbana, IL (US)

(72) Inventors: Wenjuan Zhu, Champaign, IL (US); Jialun Liu, Urbana, IL (US); Hojoon Ryu, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 115 days.

(21) Appl. No.: 16/706,004

(22) Filed: Dec. 6, 2019

(65) Prior Publication Data

US 2020/0194557 A1 Jun. 18, 2020

Related U.S. Application Data

(60) Provisional application No. 62/779,146, filed on Dec. 13, 2018.

(51) Int. Cl.
*H01L 29/16* (2006.01)
*H01L 29/786* (2006.01)
(Continued)

(52) U.S. Cl.
CPC ........ *H01L 29/1606* (2013.01); *H01L 29/516* (2013.01); *H01L 29/66045* (2013.01);
(Continued)

(58) Field of Classification Search
CPC ............. H01L 29/516; H01L 29/78391; H01L 29/78684; H01L 29/1606; H01L 29/78648
See application file for complete search history.

(56) References Cited

U.S. PATENT DOCUMENTS 8,105,928 B2 * 1/2012 Lin ..................... H01L 29/1606
438/539
9,306,028 B2 * 4/2016 Chen ................. H01L 21/02527
(Continued)

OTHER PUBLICATIONS

Liu, B. D., Chen, C. Y. & Tsao, J. Y. A modular current-mode classifier circuit for template matching application. IEEE T Circuits-li 47, 145-151, doi:Doi 10.1109/82.823544 (2000).
(Continued)

*Primary Examiner* — Daniel Luke
(74) *Attorney, Agent, or Firm* — Greer, Burns & Crain, Ltd.; Steven P. Fallon (57) ABSTRACT

A classifier circuit includes an array of dual gate graphene transistors, each of the transistors having a source, a top gate receiving one of an input voltage to be evaluated or a reference voltage, a bottom or embedded gate receiving the other of the input voltage or reference voltage and a drain, the source and drain contacting a graphene channel One of the source and the drain is connected to a voltage source. A common output combines output current of a plurality of the dual gate graphene transistors, which current varies in response to the difference between the input voltage and the reference voltage. A method for forming a classifier transistor with high remanent polarization forms dielectric with ferroelectric capability on a low resistivity substrate. A non-ferroelectric oxide layer is formed on the dielectric. A window is opened, and a graphene channel is formed in the window.

24 Claims, 11 Drawing Sheets

(51) Int. Cl.
  *H01L 29/66* (2006.01)
  *H01L 29/51* (2006.01)
  *H01L 29/78* (2006.01)

(52) U.S. Cl.
  CPC .. *H01L 29/78391* (2014.09); *H01L 29/78603* (2013.01); *H01L 29/78618* (2013.01); *H01L 29/78648* (2013.01); *H01L 29/78684* (2013.01)

(56) References Cited

U.S. PATENT DOCUMENTS 10,777,662 B2 * 9/2020 Xie .................. H01L 29/78648
2020/0124588 A1 * 4/2020 Peterson .............. G01N 33/497

OTHER PUBLICATIONS

Sedighi, B., Hu, X. S., Nahas, J. J. & Niemier, M. Nontraditional Computation Using Beyond-CMOS Tunneling Devices IEEE J Em Sel Top C 4, 438-449, doi:10.1109/Jetcas.2014.2361065 (2014).

Zhao, P., Feenstra, R. M., Gu, G. & Jena, D. SymFET: A Proposed Symmetric Graphene Tunneling Field-Effect Transistor. IEEE T Electron Dev 60, 951-957, doi:10.1109/Ted.2013.2238238 (2013).

Banerjee, S. K., Register, L. F., Tutuc, E., Reddy, D. & MacDonald, A. H. Bilayer PseudoSpin Field-Effect Transistor (BiSFET): A Proposed New Logic Device. IEEE Electr Device L 30, 158-160, doi:10.1109/Led.2008.2009362 (2009).

Mueller, S. et al. Incipient Ferroelectricity in Al-Doped HfO2 Thin Films. Advanced Functional Materials 22, 2412-2417, doi:10.1002/adfm.201103119 (2012).

Mueller, S. et al. Ferroelectricity in Gd-Doped HfO2 Thin Films. Ecs J Solid State Sc 1, N123-N126, doi:10.1149/2.002301jss (2012).

Schenk, T. et al. in Solid-State Device Research Conference (ESSDERC), 2013 Proceedings of the European. 260-263.

Muller, J. et al. Ferroelectric Hafnium Oxide: A CMOS-compatible and highly scalable approach to future ferroelectric memories. 2013 IEEE International Electron Devices Meeting (Iedm) (2013).

Yurchuk, E. et al. Impact of Scaling on the Performance of HfO2-Based Ferroelectric Field Effect Transistors. IEEE Transactions on Electron Devices 61, 3699-3706, doi:10 1109/Ted.2014.2354833 (2014).

Schroeder, U. et al. Hafnium Oxide Based CMOS Compatible Ferroelectric Materials. Ecs J Solid State Sc 2, N69-N72, doi:10.1149/2.010304jss (2013).

Chernikova, A. et al. Ultrathin Hf0.5Zr0.5O2 Ferroelectric Films on Si. Acs Appl Mater Inter 8, 7232-7237, doi: 10.1021/acsami.5b11653 (2016).

Boscke, T. S. et al. Phase transitions in ferroelectric silicon doped hafnium oxide. Appl Phys Lett 99, doi:10.1063/1.3636434 (2011).

Muller, J. et al. Ferroelectricity in yttrium-doped hafnium oxide. J Appl Phys 110, doi:10.1063/1.3667205 (2011).

Wu, Y. Q. et al. State-of-the-Art Graphene High-Frequency Electronics. Nano Letters 12, 3062-3067, doi: 10.1021/hl300904k (2012).

Baeumer, C., Rogers, S. P., Xu, R., Martin, L. W. & Shim, M. Tunable Carrier Type and Density in Graphene/PbZr0.2Ti0.8O3 Hybrid Structures through Ferroelectric Switching. Nano Letters 13, 1693-1698, doi: 10.1021/hl4002052 (2013).

* cited by examiner

CLASSIFIER CIRCUITS WITH GRAPHENE TRANSISTORS

PRIORITY CLAIM AND REFERENCE TO RELATED APPLICATION

The application claims priority under 35 U.S.C. § 119 and all applicable statutes and treaties from prior U.S. provisional application Ser. No. 62/779,146, which was filed Dec. 13, 2018, and is incorporated by reference herein.

STATEMENT OF GOVERNMENT INTEREST

This invention was made with government support under ECCS 16-53241 CAR awarded by National Science Foundation (NSF). The government has certain rights in the invention.

FIELD

The field relates generally to semiconductor devices and circuits for image recognition, motion detection, and signal processing and, in particular, classifier circuits based on graphene transistors.

BACKGROUND

Comparison between two signals is the basic function in signal processing and image recognition. This comparison function transitionally is implemented by CMOS logic devices. For current-mode classifiers based on CMOS, each pixel needs 23 transistors for the subtracter, absoluter, and squarer/divider blocks. Liu, B. D. et al. [Ref. 1] describe such a circuit. Considering a state-of-the-art smartphone camera with 12 million pixels, such a classifier circuit needs at least 276 million CMOS transistors. Consequently, this comparison function requires a significant amount of chip area and consumes a large amount of power. In addition, this type of circuit is very difficult to scale to large networks. Simulations by Sedighi, B. et al [Ref 2] have shown that using networks of interconnected nonlinear elements, such as Symmetric Graphene Tunneling Field-Effect Transistor (SymFETs) and Bilayer PseudoSpin Field-Effect Transistor (BiSFETs), to process data coming from a large number of inputs in an analog fashion can dramatically reduce power consumption. Zhao, P. et al [Ref 3] and Banerjee, S. K., et al [Ref. 4] describe the analytical models for SymFETs and BiSFETs, respectively. The SymFET or BiSFET structures include two layers of graphene separated by a very thin layer of insulator that acts as the tunneling layer. The source contacts one layer of graphene, while the drain contacts the other layer of graphene. The classifiers based on these devices rely on the negative differential resistance phenomena, which typically is only observed within a very limited operating voltage range. The two I-V branches about the valley in these devices are usually not symmetrical, which can severely distort the output. Moreover, the peak values of the current in these devices depend on the gate voltage. This is not desirable when multiple transistors are placed in parallel. More importantly, these devices do not have the storage function. The reference image needs to be loaded from the memory blocks respectively, which consume large amount of energy and latency.

SUMMARY OF THE INVENTION

A preferred embodiment is a classifier circuit that includes an array of dual gate graphene transistors, each of the transistors having a source, a top gate receiving one of an input voltage to be evaluated or a reference voltage, a bottom or embedded gate receiving the other of the input voltage or reference voltage and a drain, the source and drain contacting a graphene channel One of the source and the drain is connected to a voltage source. A common output combines output current of a plurality of the dual gate graphene transistors. The output current varies in response to the difference between the input voltage and the reference voltage.

A preferred method of forming a graphene classifier transistor includes forming dielectric with ferroelectric capability on a low resistivity substrate; forming an oxide layer on the dielectric layer; forming a recess window in the oxide layer; transferring graphene into the recess window; patterning a graphene channel using lithography and etching; forming source/drain contacts on graphene channel; depositing top gate dielectric on graphene channel; and forming a top gate electrode on the top gate dielectric layer.

BRIEF DESCRIPTION OF THE DRAWINGS

FIG. 1A-1D are schematic cross-sectional views of preferred embodiment graphene ferroelectric transistors that provide an analog comparison function.

DETAILED DESCRIPTION OF THE PREFERRED EMBODIMENTS

Preferred embodiments provide a classifier that uses graphene transistors to perform a comparison function in the analog domain instead of the traditional digital domain. Present classifier circuits leverage the ambipolar transport and zero bandgap of the graphene to perform the absolute difference function, |A-B|, directly. Classifier circuits of the invention can directly evaluate the absolute difference between reference and sample signals that are represented by or can be converted to voltages. Examples include image pixel values, sound values (e.g., as used in speech comparison or recognitions), or other sensor values such as pressure, flow, temperature mapping, and many others.

Preferred embodiments will be described with respect to image classifier circuits, and artisans will appreciate the broader applicability of the invention. Unlike an image classifier based on silicon CMOS, a classifier circuit of the invention on requires only a single transistor per pixel (or per other data element to be compared), which provides speed, chip area, energy consumption and other advantages compared to state-of-the-art CMOS classifier circuits. An additional feature of preferred classifier circuits is an ability to store a reference for comparison, which is achieved via ferroelectric graphene transistors and a method for storage and clearing of a reference from the circuit. The storage is non-volatile permanent storage and a reference can remain stored in a preferred classifier circuit until a procedure to clear or replace the reference is conducted.

Many advantages will be apparent to artisans. As an example, the operation frequency for a preferred graphene transistor classifier circuit can exceed 100 GHz, which is several orders of magnitudes higher than that for silicon CMOS classifiers. With preferred classifier circuits that include ferroelectric graphene transistors, the embedded ferroelectric layer in the graphene transistor enables the non-volatile storage of the target image inside the analog device. Therefore, a single graphene transistor can perform both image storage and comparison functions concurrently. This in-memory computing eliminates any need for frequent reference loading/unloading, to further reduce the power consumption related to the data transfer. Preferred classifier circuits are nano-function circuits based on unique material properties that are absent in traditional circuits that use CMOS logic transistors and Von Neumann architectures.

A preferred ferroelectric graphene transistor provides a new hardware format for storage and analog comparison with smaller components, better performance, power-efficiency, and capacity. The ferroelectric graphene transistor of the invention provides simple, fast, scalable and power-efficient hardware for a wide variety of storage and comparison applications. The transistor provides a memory element, and arrays of the transistors form a non-volatile memory.

In a preferred classifier circuit, each of the transistors includes an embedded gate in an insulator on a substrate, an insulator on the embedded gate, the graphene channel on the insulator, source and drain terminals contacting the graphene channel, a top gate dielectric layer on the graphene channel and a top gate on the top gate dielectric layer. Each of the transistors can include a ferroelectric layer that stores the reference voltage. The common output can combine drain or source current of a sub-group of graphene transistors in the array. Each of the transistors can include a substrate selected from the group consisting of silicon, germanium, III-V materials, sapphire, and quartz, polyethylene terephthalate (PET), polymide, poly(dimethyl siloxane) (PDMS). The substrate can be coated with a metal layer. The array of dual gate graphene transistors can be monolithically integrated with an array of imaging pixels.

In a preferred classifier circuit, each of the transistors includes a ferroelectric layer on a substrate, an insulator layer on the ferroelectric layer with a recessed window, the graphene channel on the recessed window, a source and drain terminal contacting the graphene channel, a top gate dielectric on the graphene channel and a top gate on the top gate dielectric layer. The ferroelectric dielectric layer can be selected from the group consisting of ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), and polymeric ferroelectric such as polyvinylidene fluoride (PVDF). The ferroelectric hafnium or zirconium oxide can be doped with one or more dopants selected from the group consisting of silicon (Si), yttrium (Y), aluminum (Al), gadolinium (Gd), strontium (Sr), lanthanum (La), zirconium (Zr) and hafnium (Hf). The ferroelectric layer can store the reference voltage.

In a preferred circuit, each of the transistors includes an embedded gate in an insulator formed on a substrate, a ferroelectric layer on the embedded gate, the graphene channel on the ferroelectric layer, source and drain terminals contacting the graphene channel, a top gate dielectric layer on the graphene channel and a top gate on the top gate dielectric layer. The ferroelectric dielectric layer can be selected from the group consisting of ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), and polymeric ferroelectric such as polyvinylidene fluoride (PVDF). The ferroelectric hafnium or zirconium oxide can be doped with one or more dopants selected from the group consisting of silicon (Si), yttrium (Y), aluminum (Al), gadolinium (Gd), strontium (Sr), lanthanum (La), zirconium (Zr) and hafnium (Hf). The ferroelectric layer can store the reference voltage.

A preferred circuit includes programming circuitry for setting the bottom or embedded gate voltage or programming polarization in a ferroelectric material within each of the transistors, which determines the Dirac voltage in the graphene transistors. The programming circuitry can apply a preset voltage pulse before applying a programming voltage pulse for the graphene transistors with ferroelectric layers. Evaluation circuitry can evaluate the total drain current of a plurality of the dual-gate graphene transistors as a scalar indicator of similarity between the input image and reference image.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

Figure 1A:
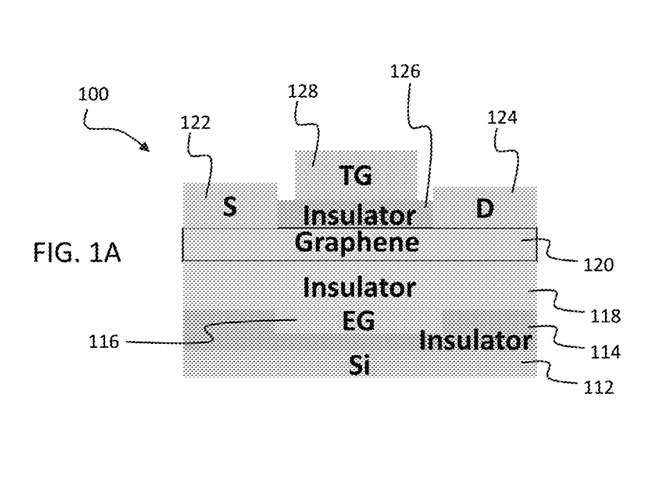
FIG. 1A is the schematic cross-sectional view of one embodiment graphene ferroelectric transistor, which consists of local embedded-gate and non-ferroelectric gate dielectrics.

FIG. 1A shows a preferred embodiment graphene ferroelectric transistor 100 that provides an analog comparison function. The transistor 100 is formed on a substrate 112 with oxide 114 that isolates an embedded bottom gate 116. A bottom gate dielectric layer 118 is deposited on the embedded gate. Graphene layer 120 is transferred on the insulator layer 118. Source terminal 122 and drain terminal 124 are formed to contact the graphene channel A top gate dielectric layer 126 is deposited on the graphene channel and a top gate electrode 128 is formed on top of the gate dielectric 126. The substrate can be either rigid or flexible. The rigid substrate can be formed from semiconducting or insulating wafers, including but not limited to silicon, germanium, III-V materials, sapphire, and quartz. The flexible substrate can be formed from materials including but not limited to polyethylene terephthalate (PET), polymide, poly (dimethyl siloxane) (PDMS).

Figure 1B:
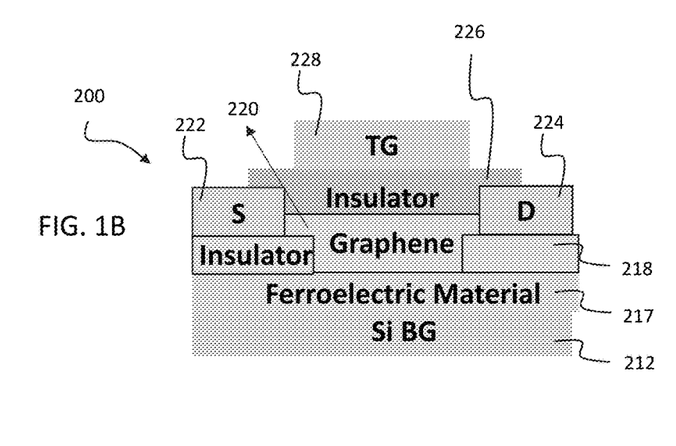
FIG. 1B is the schematic cross-sectional view of another embodiment graphene ferroelectric transistor, which consists of a ferroelectric layer and a silicon back-gate.

FIG. 1B shows another preferred embodiment graphene ferroelectric transistor 200 that provides storage and an analog comparison function. The transistor 200 is formed on a substrate 212. A ferroelectric layer 217, is deposited on the substrate 212, which provides the storage of a reference image or signal. The ferroelectric layer can be selected from materials including but not limited to ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), and polymeric ferroelectric such as polyvinylidene fluoride (PVDF). For the ferroelectric layer 217, ferroelectric hafnium or zirconium oxides are preferred because of excellent scalability, high coercive field, and full compatibility with CMOS [Ref. 5-14]. Various dopants can be used to establish or enhance ferroelectricity in ferroelectric hafnium or zirconium oxides, including but not limited to silicon (Si), yttrium (Y), aluminum (Al), gadolinium (Gd), strontium (Sr), lanthanum (La)), zirconium (Zr) and hafnium (Hf). An insulator layer 218 is formed on the ferroelectric layer 217. A recess window is formed in the insulator layer 218. Graphene layer 220 is transferred on top of the ferroelectric layer in the recess window region. Source terminal 222 and drain terminal 224 are formed to contact the graphene channel A top gate dielectric layer 226 is deposited on the graphene channel and a top gate electrode 228 is formed on top of the gate dielectric 226.

Figure 1C:
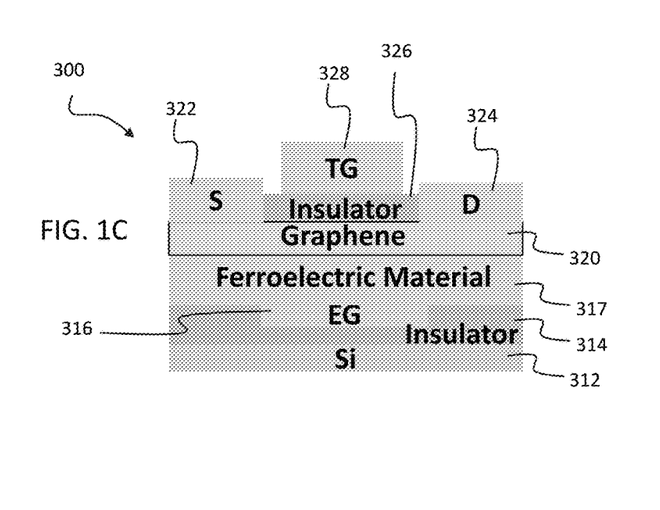
FIG. 1C is the schematic cross-sectional view of another embodiment graphene ferroelectric transistor, which consists of a ferroelectric layer and a local embedded gate.

FIG. 1C shows another preferred embodiment graphene ferroelectric transistor 300 that provides storage and an analog comparison function. The transistor 300 is formed on a substrate 312 with oxide 314 that isolates an embedded bottom gate 316. A ferroelectric layer 317 is deposited on the embedded gate. The ferroelectric layer can be selected from materials including but not limited to ferroelectric hafnium oxide, lead zirconate titanate (PZT), strontium bismuth tantalate (SBT), and lead magnesium niobate-lead titanate (PMN-PT). Graphene layer 320 is transferred on top of the ferroelectric layer. Source terminal 322 and drain terminal 324 are formed to contact the graphene channel A top gate dielectric layer 326 is deposited on the graphene channel and a top gate electrode 328 is formed on top of the gate dielectric 326.

Figure 1D:
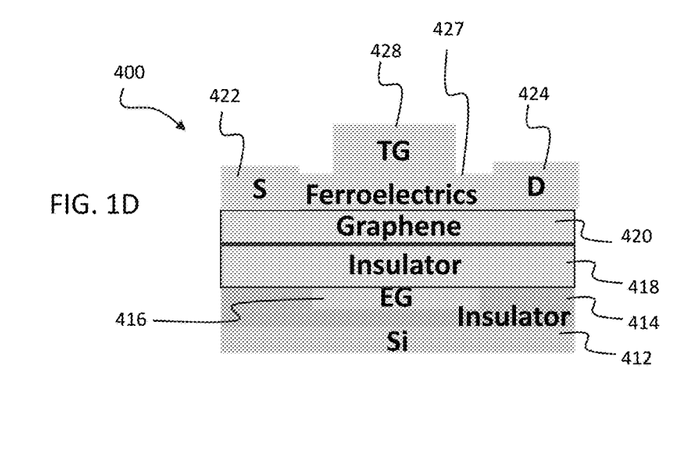
FIG. 1D is the schematic cross-section view of another embodiment graphene ferroelectric transistor, which consists of a ferroelectric layer and a local embedded gate.

FIG. 1D shows another preferred embodiment graphene ferroelectric transistor 400 that provides storage and an analog comparison function. The transistor 400 is formed on a substrate 412 with oxide 414 that isolates an embedded bottom gate 416. An insulator layer 418 is deposited on the embedded gate. Graphene layer 320 is transferred on top of the insulator 418. A ferroelectric layer 327 is formed on the graphene layer. The ferroelectric layer can be formed from material including but not limited to ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), and polymeric ferroelectric such as polyvinylidene fluoride (PVDF). Source terminal 422 and drain terminal 424 are formed to contact the graphene channel A top gate dielectric layer 426 is deposited on the graphene channel and a top gate electrode 428 is formed on top of the gate dielectric 426.

Figure 2A:
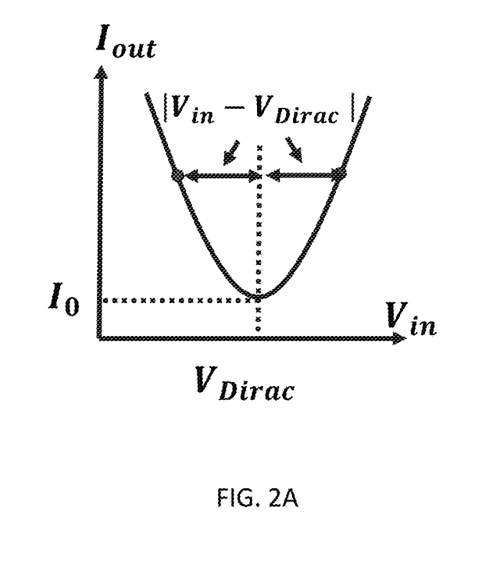
FIG. 2A shows IV characteristics of the FIG. 1A-1C transistor.

FIG. 2A shows IV characteristics of the graphene transistor 100, 200, 300 and 400. An input (sample) voltage is applied to the top gate 128, 228, 328 or 428. The output current $I_{out}$ (at the drain 124, 224, 324, or 424) varies linearly with the absolute distance between input voltage and the Dirac voltage of the graphene transistor $|V_{in} - V_{Dirac}|$.

Figure 2B:
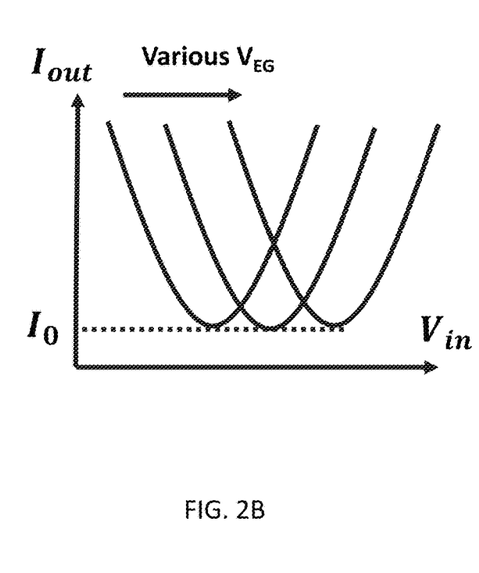
FIG. 2B illustrates drain output current of the FIG. 1A transistor as a function of top gate input voltage at various embedded gate voltages.

FIG. 2B illustrates the drain current of the transistor 100 as a function of top gate input voltage at various embedded gate voltages. The Dirac voltage of the graphene transistor is determined by the embedded gate voltage $V_{EG}$.

Figure 2C:
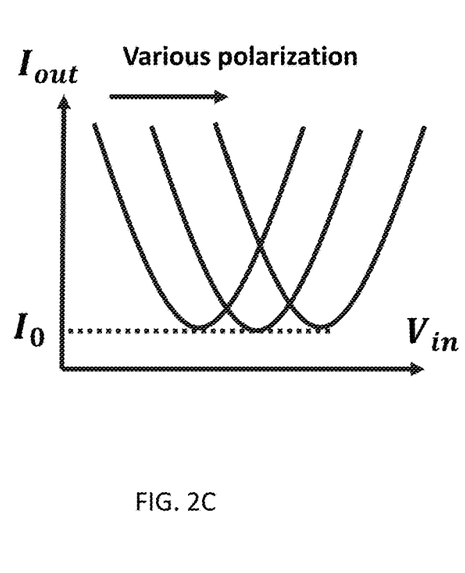
FIG. 2C illustrates drain output current of the FIG. 1B-1D transistors as a function of top gate input voltage at various polarization in the ferroelectric layer.

FIG. 2C illustrates the drain current of the transistor 200, 300 or 400 as a function of top gate input voltage at various polarization level in the ferroelectric layer 217, 317 or 427. The Dirac voltage of the graphene transistor is determined by the polarization level in the ferroelectric layer. The information of the reference value (e.g., target image) can be programmed and stored as the level of polarization in the ferroelectric layer. Each graphene ferroelectric transistor in an array will have both storage and analog processing dual function. This local storage of the reference value will significantly reduce the chip size and power consumption related to the data transfer.

Figure 3A:
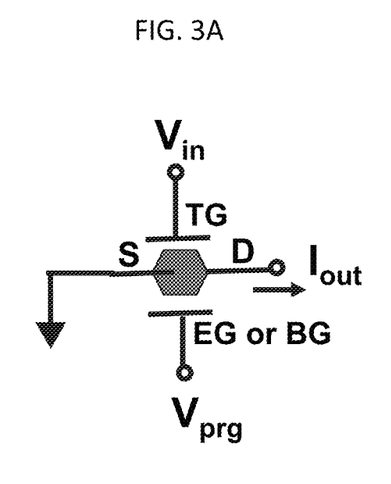
FIG. 3A illustrates the symbol of the graphene transistor in FIG. 1A, 1B, 1C or 1D.

FIG. 3A is the schematic symbol of the transistor 100, 200, 300 or 400. An input voltage (sample) is applied to the top gate (128, 228, 328 or 428). For transistor 100, the reference voltage (target voltage) is applied to the embedded gate 116. For transistor 200, the program pulse is applied between the bottom gate 212 and the top gate 228. For transistor 300 and 400, the program pulse is applied between the embedded gate 316 or 416 and the top gate 328 or 428. The source 122, 222, 322 or 422 is grounded. At the drain terminal 124, 224, 324, or 424, a drain voltage is applied and the drain current is obtained. Note, the source and drain terminals are interchangeable. If the drain (or source) is grounded, the current can also be measured at the source (or drain) terminal For transistor 100, the top gate and the embedded gate are interchangeable.

Figure 3B:
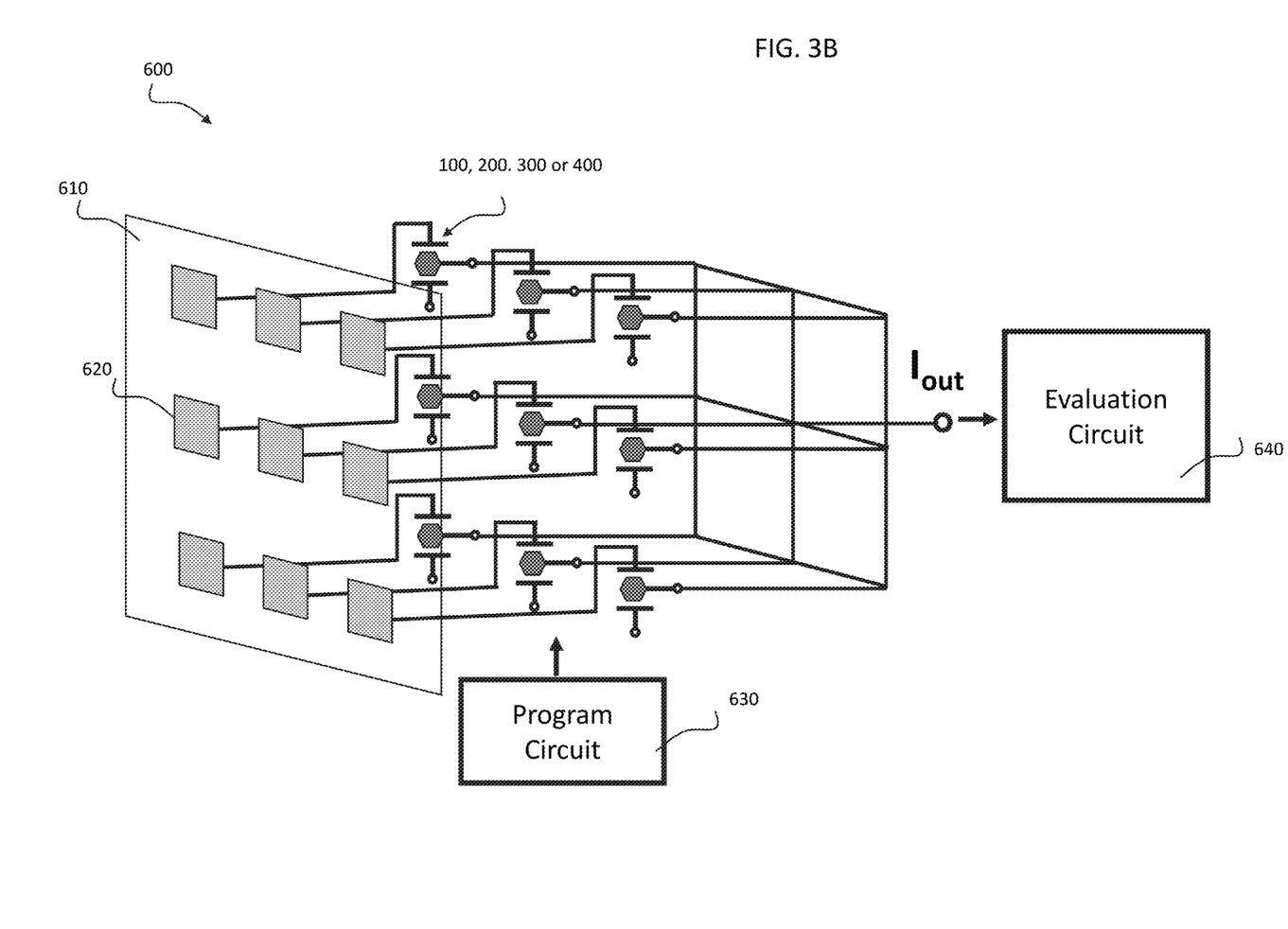
FIG. 3B is a schematic circuit diagram of a preferred classifier circuit.

FIG. 3B illustrates a preferred classifier circuit 600 that receives pixel values of an image. An array 610 of pixels 620 provides sensed values to the classifier circuit 600. Each pixel 620 provides a sample voltage to the top gate of a corresponding graphene transistor 100, 200, 300 or 400. Nine pixels are shown for simplicity of illustration corresponding to nine graphene transistors 100, 200, 300 or 400. Program (reference) voltages and reset voltages can be provided by a program circuit 630. The number of pixels and transistors can, of course, number in the millions. The drain currents from the graphene transistors are combined to provide an output current $I_{out}$ that will vary in an analog level according to the total amount of differences between the sample image of the nine pixels and a stored or applied reference values that are provided at the bottom gates of the graphene transistors 100, 200, 300 or 400. With expanded arrays, the current from tens, hundreds, thousands and millions of transistors could be combined. Alternatively, sub-groups of transistors can have current combined and multiple $I_{out}$ currents can be produced. The combined current is evaluated by an evaluation circuit 640, which uses the drain current as a scalar indicator of similarity. Having sub-groups could, for example, provide a level of difference in a particular region of an image, while the total combined currents provide an overall level of difference. Because the graphene transistors can be monolithically integrated with CMOS. The program and evaluation circuits can be CMOS circuits.

Figure 3C:
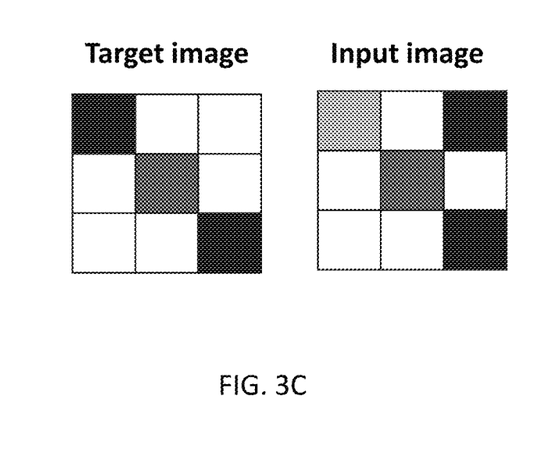
FIG. 3C provides an example illustration of a reference (target) image and a sample (input) image in grayscale.

FIG. 3C provides an example illustration of a reference (target) image and a sample (input) image in grayscale. The minimum output current occurs when the input voltage is equal to the target voltage for every pixel. The output current is a scalar indicator of the degree of matching between input image and target image. For a color image classier, each pixel would preferably have three graphene classifier transistors, one for each of three color channels.

The pixels 630 of the array 610 can be directly provided, such as from an image sensor. Artisans will also appreciate, however, that the values of the pixels could also be provided by pre-processing from an image processing pipelines. The types of image pre-processing steps can include, for example, intelligent selection of images portions to compare, color and level correction, or even machine learning to select data to provide to the pixels, e.g. facial recognition processing can isolate an image of a human face to provide to the pixels 630 for comparison of a reference image of a human face.

Experimental Prototypes and Testing.

Experiments demonstrate preferred classifier circuits and ferroelectric graphene transistors of the invention. Dual-gate ferroelectric graphene transistors with 12 nm ferroelectric hafnium zirconium oxide were successfully fabricated.

Figure 4A:
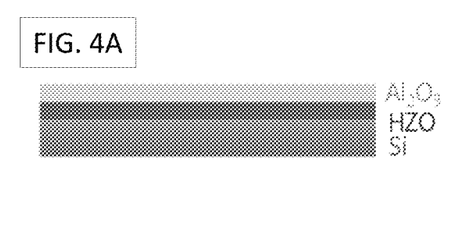
FIGS. 4A-4F shows the experimental process flow for the fabrication of experimental transistors consistent with the FIG. 1B transistor.
Figure 4B:
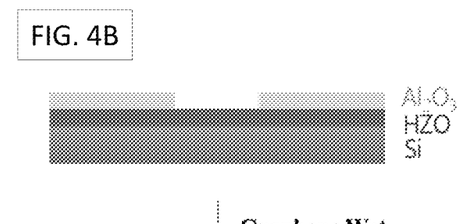
Figure 4C:
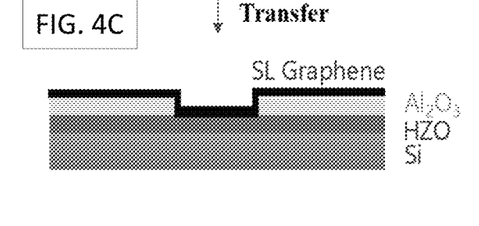
Figure 4D:
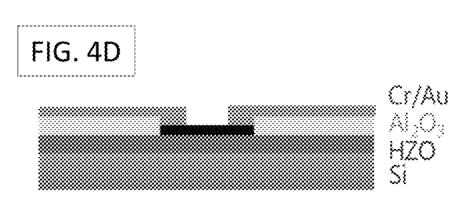
Figure 4E:
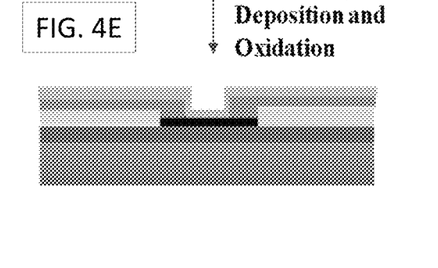
Figure 4F:
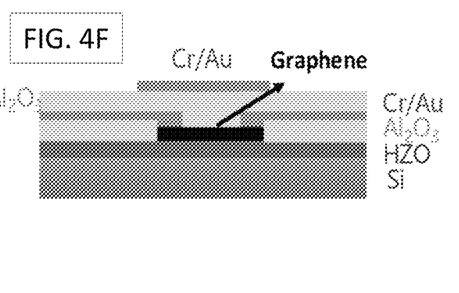

FIGS. 4A-4F shows the experimental process flow for the fabrication of experimental transistors consistent with the FIG. 1B transistor. In FIG. 4A, hafnium zirconium oxide (or another dielectric that has ferroelectric capability, i.e., is or can be converted to ferroelectric material) is deposited on a low resistivity substrate, e.g., highly doped silicon substrate, followed by non-ferroelectric oxide (e.g., $Al_2O_3$) layer deposition. RTA annealing at 500° C. is performed to induce ferroelectric phase transformation. Our measurement indicates a high remanent polarization ~30 μC/cm² with ±10 V pulses. In FIG. 4B, a window is patterned in the channel region and the $Al_2O_3$ layer is removed using hot phosphorus acid. In FIG. 4C, CVD graphene is grown and after graphene formation, Poly(methyl methacrylate) (PMMA) is spin-coated on the top of the graphene layer. A Cu foil is then dissolved in copper etchant In FIG. 4D, the graphene is patterned using lithography and $O_2$ plasma. Source/drain contacts (Cr/Au) are formed using lithography and ebeam deposition. In FIG. 4E, 2 nm Al is deposited on the graphene and then re-oxidized to enhance the nucleation of the top gate dielectrics. In FIG. 4F, 20 nm $Al_2O_3$ is deposited on top of the device using atomic layer deposition (ALD). The top gate electrode (Cr/Au) is formed on the $Al_2O_3$ layer.

Figure 5A:
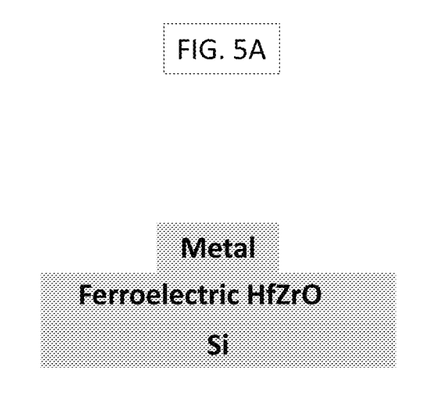
FIG. 5A-5B show the schematic and the polarization-voltage loops of a ferroelectric capacitor based on hafnium zirconium oxide measured in various voltage range.
Figure 5B:
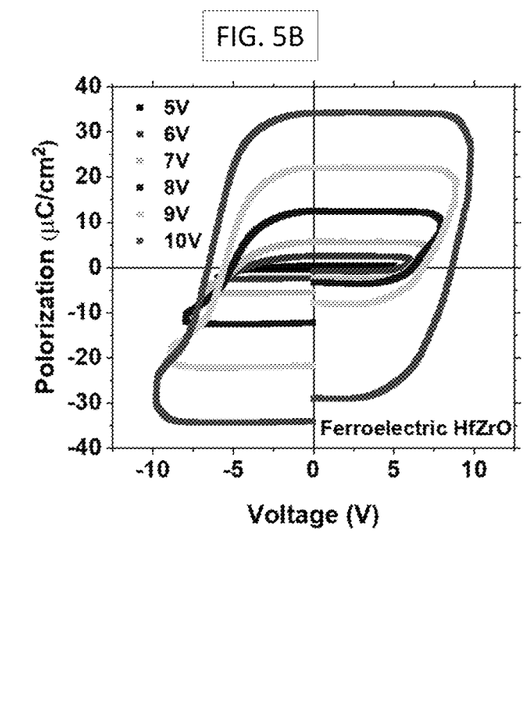

To monitor the ferroelectricity of the hafnium zirconium oxide, test capacitors were also fabricated. FIG. 5A illustrate the structure of the ferroelectric capacitor with hafnium zirconium oxide on silicon substrate. FIG. 5B shows the polarization~voltage loops of a ferroelectric capacitor with 12 nm hafnium zirconium oxide measured in various gate voltage range. The remanent polarization of ferroelectric hafnium zirconium oxide can exceed 30 μC/cm² indicating that the film has strong ferroelectricity.

Figure 6A:
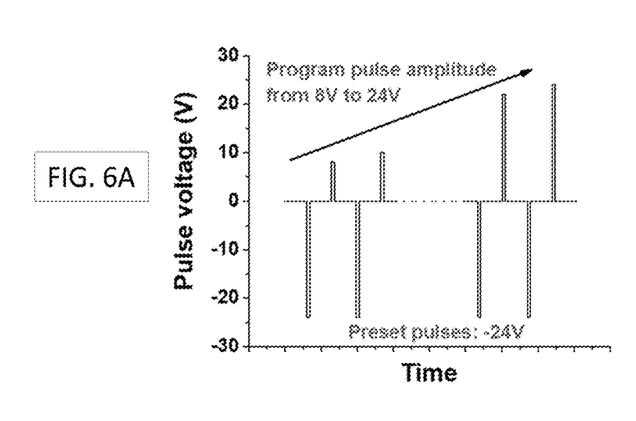
FIGS. 6A-6F show the waveforms of various program pulses and the transfer curves of experimental graphene transistors after applying various program pulses.
Figure 6B:
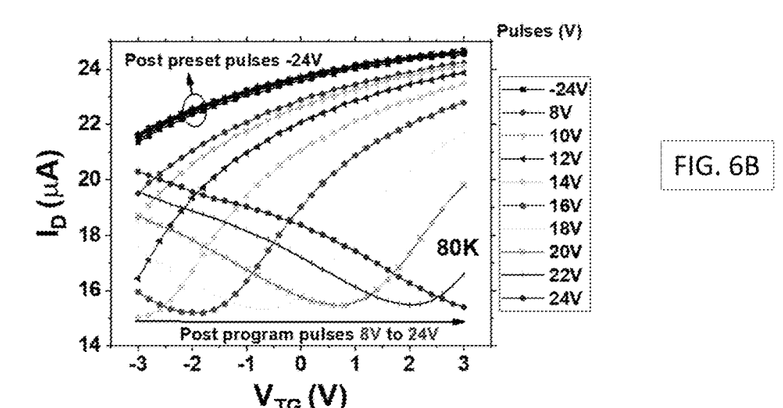
Figure 6C:
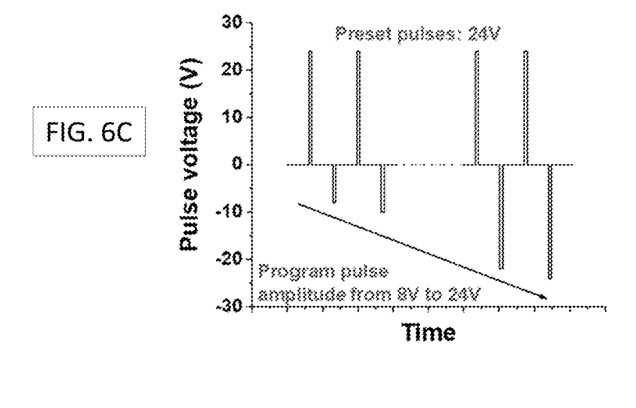
Figure 6D:
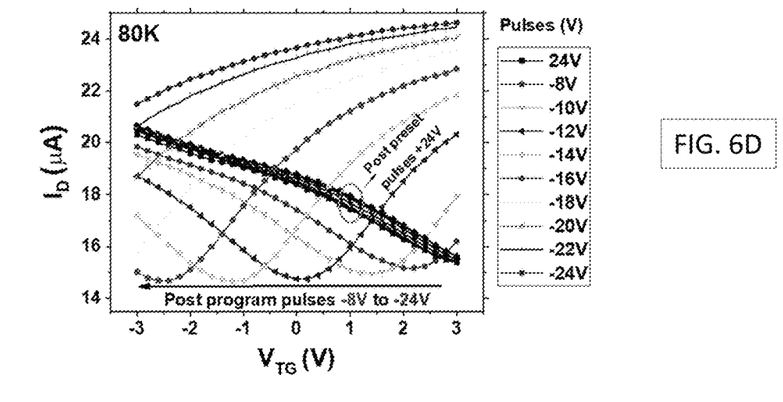

FIGS. 6A-6D show polarization and Dirac voltage of graphene transistor tested using various program pulses. FIGS. 6A and 6C show waveforms of the positive and negative program pulses, respectively. A preset pulse is applied before each program pulse. The pulse width is 4 ms and the amplitude of the program pulse increases from 8 V to 24 V. A fast $I_D$-$V_{TG}$ sweep is taken after each program pulse to read the Dirac voltage. FIGS. 6B and 6D show transfer characteristics of the graphene transistor after positive and negative program pulses, respectively. The $I_D$-$V_{TG}$ characteristics shift consistently with increasing pulse amplitude for both positive and negative pulses. Note, the minimum conductance at the charge neutrality point is nearly unchanged when the program pulse amplitudes are varied, which is an important feature for image processing, so that the current from all pixels can be equally weighted, regardless of the target voltage value.

Figure 6E:
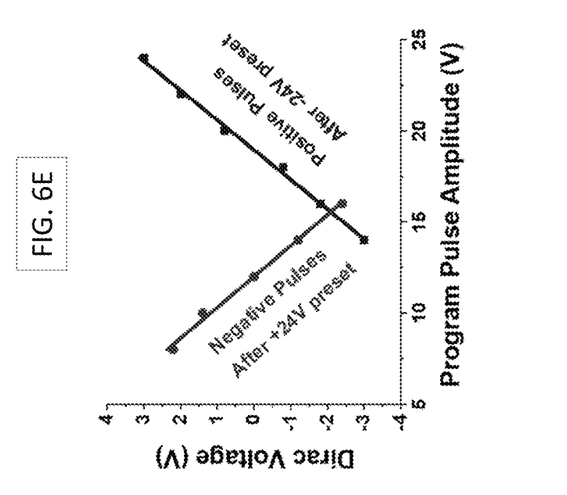

FIG. 6E shows extracted Dirac voltage as a function of program pulse amplitude for positive and negative program pulses. The Dirac voltages follow an approximate linear relationship with the pulse amplitude for both positive and negative program pulses. Based on this correlation, the target Dirac voltages can be converted to the program pulse voltages.

Figure 6F:
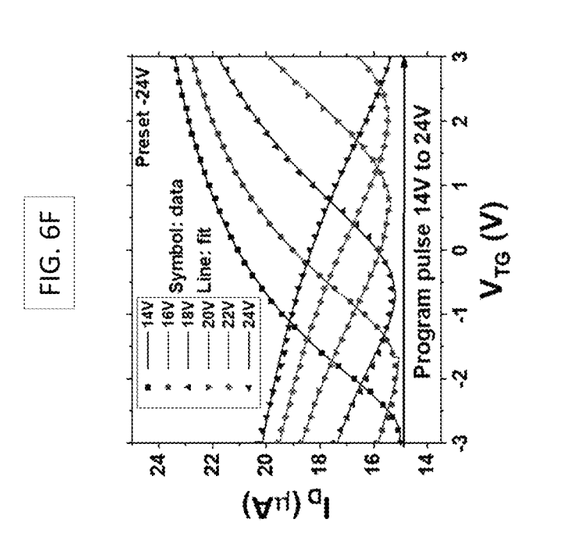

FIG. 6F is a modeling of the transfer curves of the ferroelectric graphene transistor after positive program pulses. The transport of the ferroelectric graphene transistor is modeled using the following equation:

$$\sigma \approx \mu \sqrt{(en_{Dirac})^2 + C_{TG}^2(V_{TG}-V_{Dirac})^2} \quad (1)$$

where $\sigma$ is the conductivity of the graphene channel, $n_{Dirac}$ is the carrier density at Dirac point, $C_{TG}$ is the top gate capacitance, $V_{Dirac}$ is the Dirac voltage, $V_{TG}$ is the top gate voltage, and e is electron charge. The graphene channel resistance is $$R_{ch} = \frac{l}{\sigma W},$$

where l and W are the length and width of the graphene channel respectively. Considering the contact resistance $R_c$, the total resistance of the device can be expressed as $R_{total}=R_{ch}+R_c$. The drain current can be calculated from $I_D=V_D/R_{total}$, where $V_D$ is drain voltage. FIG. 6F shows the measured data and the modeled result. This model fits the experimental results very well. Based on this model, the drain current of the ferroelectric graphene transistor can be predicted at any given input voltage $V_{TG}$ for given Dirac voltage $V_{Dirac}$; i.e., the output current for a given pair of input and target images can be predicted.

Image comparison tests were simulated using the experimental result of the graphene transistor show in FIG. 6F. The graphene transistors are arranged into a 3×3 array, where the drain terminals are connected together, and the total drain current is monitored as the output current $I_{out}$. A photodetector array can be put on top of the graphene classifier. For each pixel, the output of the photodetector is linked to the top gate of the graphene classifier through a voltage converter and an amplifier. The Dirac voltage of each graphene transistor is programmed according to the target/reference image. The total drain output current serves as a scalar indicator of the level of similarity between the input and target images.

Figure 7A:
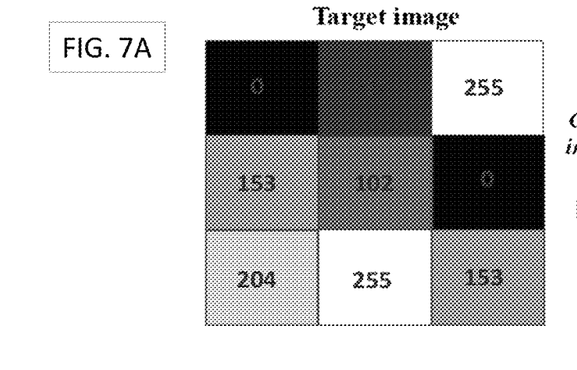
FIGS. 7A-7D illustrate the conversion of a target/reference image to an array of program pulses.
Figure 7B:
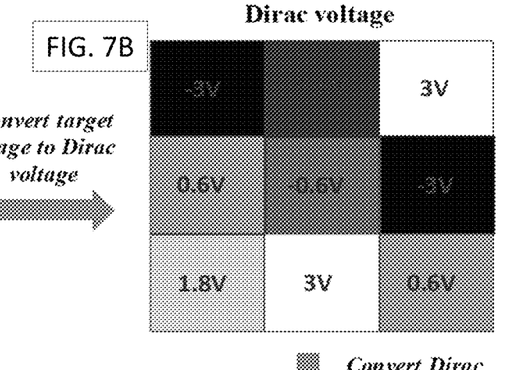
Figure 7C:
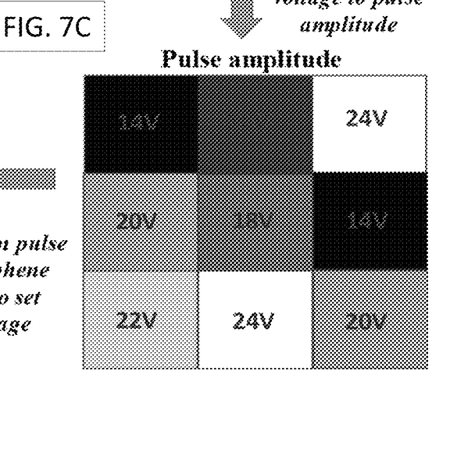
Figure 7D:
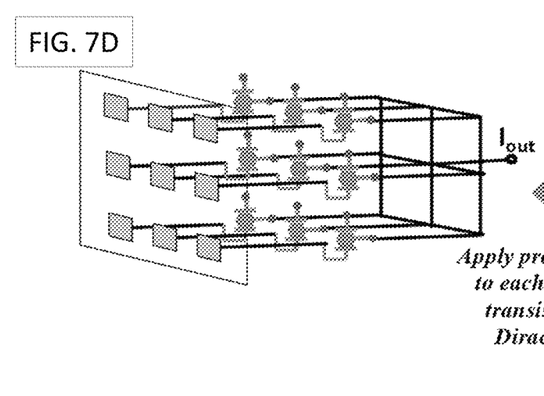

FIGS. 7A-7D illustrate the conversion of the target/reference image to the array of program voltages. FIG. 7A is a representation of the 9 pixel target image with 3×3 pixels in gray-scale (256-levels). FIG. 7B illustrates that the target image is converted to a map of Dirac voltages for the graphene transistors. FIG. 7C illustrates that the target Dirac voltages are translated into the program pulse voltages. FIG. 7D illustrates that the program pulses are applied to the 3×3 array of ferroelectric graphene transistors to store the target image in the classifier. The image levels [0 to 255] correspond to the Dirac voltage range of [−3 V to 3 V] and program pulse voltage [14 V to 24 V].

Figure 8A:
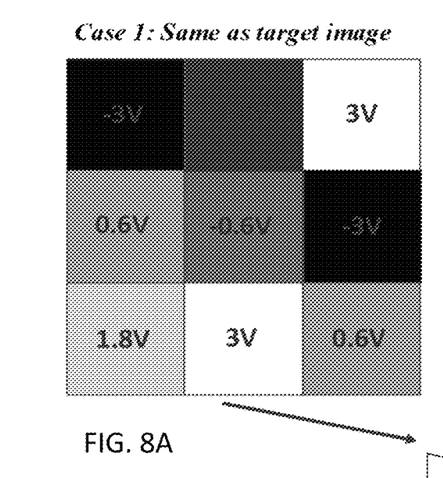
FIGS. 8A-8D illustrate comparison operations between a target image and three different input images (FIGS. 8A-8C) using the preferred graphene classifier circuit represented in FIG. 8D.
Figure 8B:
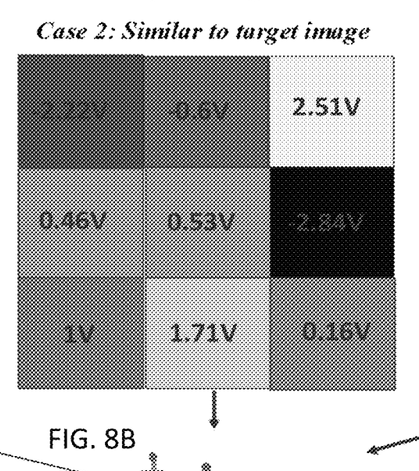
Figure 8C:
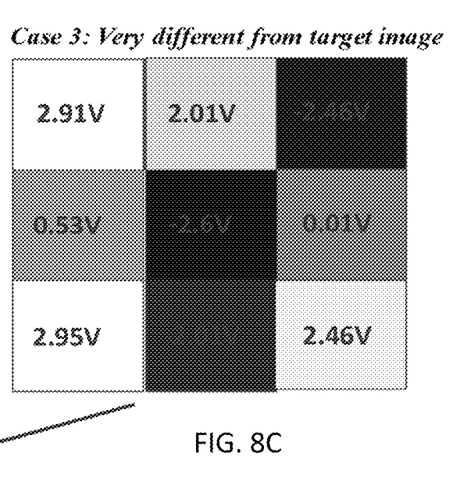
Figure 8D:
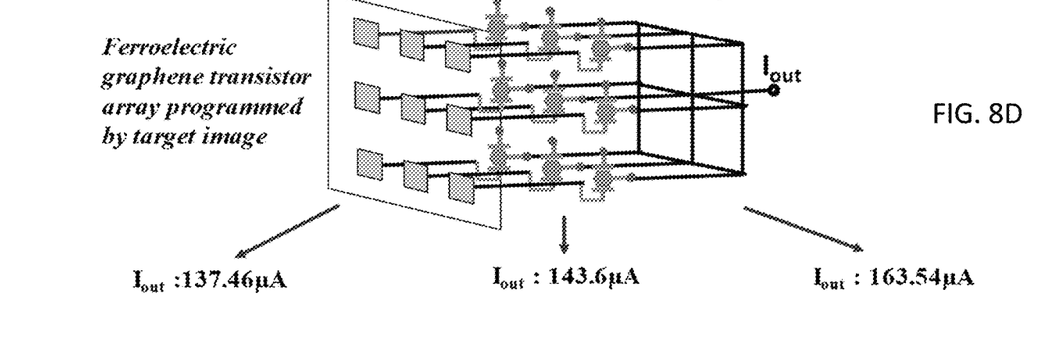

FIGS. 8A-8C illustrate comparison operations between an input image and target image for three different cases in a classifier circuit of the invention. Case 1: The input image is the same as the target image, so the top gate voltage is equal to the Dirac voltage at every graphene transistors in the array. The drain current reaches minimum at every transistor in this case. Case 2: The input image is similar to the target image, then the top gate voltage will be slightly different from the Dirac voltage in at least some graphene transistors. Case 3: The input image is very different from the target image. These input images are converted to the maps of top gate voltages, labeled on each pixel. The corresponding total output currents for these three input images are 137.46 µA, 143.6 µA, and 163.54 µA respectively. The output current serves as a scalar indicator of the similarity level between the input and target images. Low output current represents high similarity between two images.

Artisans will appreciate that the comparison function in classifier circuits of the invention can be carried out in one single step, which can be achieved at very high speed. In addition to the circuit simplicity, the extremely high mobility in graphene can further improve the operating speed. The operating frequency of graphene transistors can be above 300 GHz, which means that the image comparison in graphene transistors can be completed within 10 ps. In contrast, the silicon CMOS based classifiers need four stages of calculation and the operating frequency is typically in MHz regime. In addition, as compared to the 23 transistors required by the CMOS based classifier, the image classifier based on graphene transistor of the invention only needs one transistor per pixel, which can significantly reduce the chip area. In preferred embodiments, the target image is stored in the classifier array using a ferroelectric layer, which is non-volatile. This design can further reduce the energy consumption related to data storage and transportation. Furthermore, these graphene classifier arrays are especially suitable for large networks, where the output current from each transistors can be directly summed up. Regardless of the number of units in the array, the operation time remains constant, which is extremely advantageous for sensor network applications.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

REFERENCES

[1] Liu, B. D., Chen, C. Y. & Tsao, J. Y. A modular current-mode classifier circuit for template matching application. IEEE T Circuits-Ii 47, 145-151, doi:Doi 10.1109/82.823544 (2000).

[2] Sedighi, B., Hu, X. S., Nahas, J. J. & Niemier, M. Nontraditional Computation Using Beyond-CMOS Tunneling Devices. IEEE J Em Sel Top C 4, 438-449, doi:10.1109/Jetcas.2014.2361065 (2014).

[3] Zhao, P., Feenstra, R. M., Gu, G. & Jena, D. SymFET: A Proposed Symmetric Graphene Tunneling Field-Effect Transistor. IEEE T Electron Dev 60, 951-957, doi:10.1109/Ted.2013.2238238 (2013).

[4] Banerjee, S. K., Register, L. F., Tutuc, E., Reddy, D. & MacDonald, A. H. Bilayer PseudoSpin Field-Effect Transistor (BiSFET): A Proposed New Logic Device. IEEE Electr Device L 30, 158-160, doi: 10.1109/Led.2008.2009362 (2009).

[5] N. Gong, X. S., H. Jiang, Q. Xia and T. P. Ma. in 46th IEEE Semiconductor Interface Specialists Conference (Arlington, Va., 2015).

[6] Mueller, S. et al. Incipient Ferroelectricity in Al-Doped $HfO_2$ Thin Films. Advanced Functional Materials 22, 2412-2417, doi:10.1002/adfm.201103119 (2012).

[7] Mueller, S. et al. Ferroelectricity in Gd-Doped HfO2 Thin Films. Ecs J Solid State Sc 1, N123-N126, doi:10.1149/2.002301jss (2012).

[8] Schenk, T. et al. in Solid-State Device Research Conference (ESSDERC), 2013 Proceedings of the European. 260-263.

[9] Muller, J. et al. Ferroelectric Hafnium Oxide: A CMOS-compatible and highly scalable approach to future ferroelectric memories. 2013 IEEE International Electron Devices Meeting (Iedm) (2013).

[10] Yurchuk, E. et al. Impact of Scaling on the Performance of $HfO_2$-Based Ferroelectric Field Effect Transistors. IEEE Transactions on Electron Devices 61, 3699-3706, doi:10.1109/Ted.2014.2354833 (2014).

[11] Schroeder, U. et al. Hafnium Oxide Based CMOS Compatible Ferroelectric Materials. Ecs J Solid State Sc 2, N69-N72, doi:10.1149/2.010304jss (2013).

[12] Chernikova, A. et al. Ultrathin $Hf_{0.5}Zr_{0.5}O_2$ Ferroelectric Films on Si. Acs Appl Mater Inter 8, 7232-7237, doi:10.1021/acsami.5b11653 (2016).

[13] Boscke, T. S. et al. Phase transitions in ferroelectric silicon doped hafnium oxide. Appl Phys Lett 99, doi:10.1063/1.3636434 (2011).

[14] Muller, J. et al. Ferroelectricity in yttrium-doped hafnium oxide. J Appl Phys 110, doi:10.1063/1.3667205 (2011).

[15] Wu, Y. Q. et al. State-of-the-Art Graphene High-Frequency Electronics. Nano Letters 12, 3062-3067, doi: 10.1021/nl300904k (2012).

[16] Baeumer, C., Rogers, S. P., Xu, R., Martin, L. W. & Shim, M. Tunable Carrier Type and Density in Graphene/$PbZr_{0.2}Ti_{0.8}O_3$ Hybrid Structures through Ferroelectric Switching. Nano Letters 13, 1693-1698, doi:10.1021/nl4002052 (2013).

The invention claimed is:

1. A classifier circuit, comprising:
an array of dual gate graphene transistors, each of the transistors having a source, a top gate receiving one of an input voltage to be evaluated or a reference voltage, a bottom or embedded gate receiving the other of the input voltage or reference voltage and a drain, the source and drain contacting a graphene channel, wherein one of the source and the drain is connected to a voltage source; and
a common output combining output current of a plurality of the dual gate graphene transistors, the output current varying in response to the difference between the input voltage and the reference voltage.

2. The circuit of claim 1, wherein each of the transistors comprises an embedded gate in an insulator on a substrate, an insulator on the embedded gate, the graphene channel on the insulator, source and drain terminals contacting the graphene channel, a top gate dielectric layer on the graphene channel and a top gate on the top gate dielectric layer.

3. The circuit of claim 1, wherein each of the transistors comprises a ferroelectric layer on a substrate, an insulator layer on the ferroelectric layer with a recessed window, the graphene channel on the recessed window, a source and drain terminal contacting the graphene channel, a top gate dielectric on the graphene channel and a top gate on the top gate dielectric layer.

4. The circuit of claim 3, wherein the ferroelectric layer is selected from the group consisting of ferroelectric hafnium or zirconium oxide, perovskite including lead zirconate titanate (PZT), Barium titanate (BTO), and lead magnesium niobate-lead titanate (PMN-PT), and aurivillius compounds including strontium bismuth tantalate (SBT), and polymeric ferroelectric, including polyvinylidene fluoride (PVDF).

5. The circuit of claim 4, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

6. The circuit of claim 3, wherein the ferroelectric layer stores the reference voltage.

7. The circuit of claim 1, wherein each of the transistors comprises an embedded gate in an insulator formed on a substrate, a ferroelectric layer on the embedded gate, the graphene channel on the ferroelectric layer, source and drain terminals contacting the graphene channel, a top gate dielectric layer on the graphene channel and a top gate on the top gate dielectric layer.

8. The circuit of claim 7, wherein the ferroelectric layer is selected from the group consisting of ferroelectric hafnium or zirconium oxide, perovskite including lead zirconate titanate (PZT), Barium titanate (BTO), and lead magnesium niobate-lead titanate (PMN-PT), and aurivillius compounds including strontium bismuth tantalate (SBT), and polymeric ferroelectric,.

9. The circuit of claim 8, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

10. The circuit of claim 8, wherein the ferroelectric layer stores the reference voltage.

11. The circuit of claim 1, wherein each of the transistors comprises an embedded gate in an insulator formed on a substrate, an insulator on the embedded gate, the graphene channel on the insulator, source and drain terminals contacting the graphene channel, a ferroelectric layer on the graphene layer, and a top gate on the ferroelectric layer.

12. The circuit of claim 11, wherein the ferroelectric layer is selected from the group consisting of ferroelectric hafnium or zirconium oxide, perovskite such as lead zirconate titanate (PZT), Barium titanate (BTO), and lead magnesium niobate-lead titanate (PMN-PT), aurivillius compounds such as strontium bismuth tantalate (SBT), and polymeric ferroelectric such as polyvinylidene fluoride (PVDF).

13. The circuit of claim 12, wherein the ferroelectric hafnium or zirconium oxide is doped with one or more dopants selected from the group consisting of silicon (Si), yttrium (Y), aluminum (Al), gadolinium (Gd), strontium (Sr), and lanthanum (La), zirconium (Zr) or hafnium (Hf).

14. The circuit of claim 11, wherein the ferroelectric layer stores the reference voltage.

15. The circuit of claim 1, wherein each of the transistors comprises a ferroelectric layer that stores the reference voltage.

16. The circuit of claim 1, wherein the common output combines drain or source current of a sub-group of graphene transistors in the array.

17. The circuit of claim 1, wherein the common output is taken from one of the source and drain that is not connected to the voltage source.

18. The circuit of claim 1, wherein the common output is taken from one of the source and drain that is connected to the voltage source.

19. The circuit of claim 1, wherein each of the transistors comprises a substrate selected from the group consisting of silicon, germanium, III-V materials, sapphire, and quartz, polyethylene terephthalate (PET), polymide, poly(dimethyl siloxane) (PDMS).

20. The circuit of claim 19, wherein the substrate is coated with metal layer.

21. The circuit of claim 1, wherein the array of dual gate graphene transistors is monolithically integrated with an array of imaging pixels.

22. The circuit of claim 1, comprising programming circuitry for setting the bottom or embedded gate voltage or programming polarization in a ferroelectric material within each of the transistors, which determines the Dirac voltage in the graphene transistors.

23. The circuit of claim 22, wherein the programming circuitry applies a preset voltage pulse before applying a programming voltage pulse for the graphene transistors with ferroelectric layers.

24. The circuit of claim 1, further comprising evaluation circuitry that evaluates the total drain current of a plurality of the dual-gate graphene transistors as a scalar indicator of similarity between the input image and reference image.

* * * * *